(12) United States Patent
Waight et al.

(10) Patent No.: US 7,043,211 B1
(45) Date of Patent: May 9, 2006

(54) UNIVERSAL MODULATOR

(75) Inventors: Matthew G. Waight, Pipersville, PA (US); Dipakkumar R. Patel, Hatboro, PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/857,010

(22) PCT Filed: Nov. 30, 1999

(86) PCT No.: PCT/US99/28232

§ 371 (c)(1),
(2), (4) Date: May 29, 2001

(87) PCT Pub. No.: WO00/33457

PCT Pub. Date: Jun. 8, 2000

Related U.S. Application Data (60) Provisional application No. 60/110,254, filed on Nov. 30, 1998.

(51) Int. Cl.
*H04B 1/04* (2006.01)
*H04B 1/26* (2006.01)
*H04N 3/27* (2006.01)
*H04N 5/455* (2006.01)
*H04N 7/16* (2006.01)

(52) U.S. Cl. ............... 455/118; 455/102; 455/313; 455/196.1; 455/255; 348/554; 348/726; 348/729; 725/151

(58) Field of Classification Search ............ 455/296, 455/302, 313–315, 317, 323, 227, 255, 258, 455/196.1, 118, 102, 103; 348/554, 555, 348/725, 726, 729; 725/151
See application file for complete search history.

(56) References Cited

U.S. PATENT DOCUMENTS

| | | | | | |
|---|---|---|---|---|---|
| 3,639,840 | A | * | 2/1972 | Shekel et al. | 725/151 |
| 3,763,357 | A | * | 10/1973 | Morton | 377/10 |
| 4,054,794 | A | * | 10/1977 | Laughlin et al. | 398/130 |
| 4,512,035 | A | * | 4/1985 | Victor et al. | 455/165.1 |
| 4,742,544 | A | * | 5/1988 | Kupnicki et al. | 380/215 |
| 4,794,458 | A | * | 12/1988 | Nagatomi | 348/724 |
| 4,825,286 | A | * | 4/1989 | Graves | 348/484 |
| 4,959,827 | A | * | 9/1990 | Grotzinger et al. | 398/90 |
| 5,038,404 | A | | 8/1991 | Marz | |
| 5,640,697 | A | | 6/1997 | Orndorff | |
| 5,796,423 | A | * | 8/1998 | Robbins et al. | 725/151 |

(Continued)

FOREIGN PATENT DOCUMENTS

DE    4306578 A1    3/1993

(Continued)

*Primary Examiner*—Duc M. Nguyen
(74) *Attorney, Agent, or Firm*—Benjamin D. Driscoll (57) ABSTRACT

A modulator generates a combined signal consisting of audio and video signals and converts the combined signal to one of a plurality of frequencies in dependence upon a desired output frequency and broadcast standard. The modulator includes a summing amplifier, a first frequency synthesizer and a second frequency synthesizer. The summing amplifier has a first input for receiving a video signal, a second input for receiving a first audio signal, a third input for receiving a second audio signal, and an output for outputting a modulated summed signal. The first frequency synthesizer generates a first frequency for mixing with the modulated summed signal to generate a high intermediate frequency (HI-IF) signal. The second frequency synthesizer generates a second frequency for mixing with said HI-IF signal to generate a desired RF output signal.

13 Claims, 8 Drawing Sheets

U.S. PATENT DOCUMENTS

| | | | | |
|---|---|---|---|---|
| 5,847,612 A | * | 12/1998 | Birleson | 331/2 |
| 5,875,389 A | * | 2/1999 | Yokoyama | 455/203 |
| 5,970,053 A | * | 10/1999 | Schick et al. | 370/252 |
| 6,057,876 A | * | 5/2000 | Waight | 725/151 |

FOREIGN PATENT DOCUMENTS

| | | |
|---|---|---|
| WO | WO8404637 | 11/1984 |
| WO | WO9723034 | 6/1997 |

* cited by examiner

UNIVERSAL MODULATOR

BACKGROUND

The present invention generally relates to cable television (CATV) and consumer video communication systems. More particularly, the invention relates to a dual-conversion universal modulator having programmable synthesized phase-locked loop oscillators driving their respective mixers which select a specific HI-IF frequency depending upon what output frequencies or standards are desired. Such standards include NTSC, PAL, NICAM, DIN, SECAM and any other known standard.

To allow reception of more than the 12 VHF channels on an older television receiver, most CATV systems require a settop terminal at a subscriber's location. Today, settop terminals not only provide a means for accepting a plurality of channels broadcast with varying bandwidths and guardbands for forward and reverse frequencies, but they also secure pay television services from unauthorized viewing. Other functions include decoding digital video and audio, interactive services, creating personalized viewer channels and the like.

In addition to the conversion from a cable transmission to a standard output frequency, a variety of descrambling techniques are employed depending upon the techniques used at a system headend. CATV equipment manufacturers are developing more sophisticated scrambling techniques using complicated encryption methods and digital processing to thwart pirating.

Figure 1:
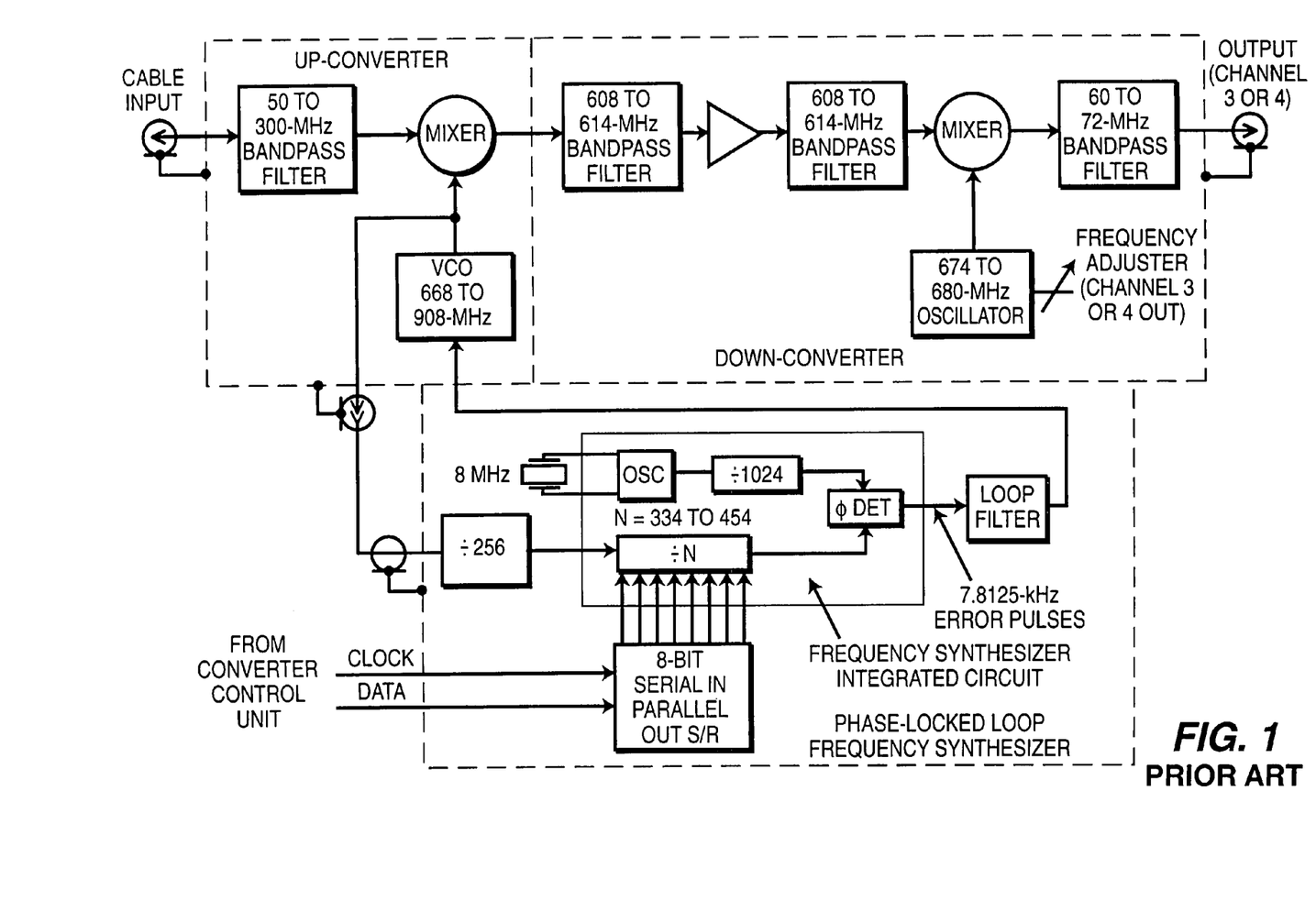
FIG. 1 is a block diagram of a prior art CATV settop terminal.

Most settop terminals are tunable. A block diagram for a prior art settop terminal is shown in FIG. 1. Incoming signals from a CATV transmission network are coupled to an input bandpass amplifier and up-converted to a high intermediate frequency (HI-IF). The up-conversion requires a tunable local oscillator which selects a desired channel and an associated mixer. The mixer is coupled to a bandpass filter and down-converted to an IF channel using a fixed-frequency local oscillator and mixer. The output channel is filtered and forwarded to a subscriber's television receiver. Prior art settop terminals use one down-converter mixer with an oscillator having slight frequency agility to provide an output at one or two preselected channel frequencies. The output frequencies and bandwidths depend upon the transmission standard used.

In the United States, the NTSC (National Television System Committee) is the standard for color television. Other countries have chosen different systems. SECAM (sequentiel couleur avec mémoire) is used by France and Russia. PAL A and PAL B (phase alternation line) are used by many European countries such as Germany and the United Kingdom. Accordingly, television receivers are typically manufactured for a specific transmission standard. For worldwide use, a settop terminal must be adapted to the established broadcast standards.

U.S. Pat. No. 5,640,697 teaches the use of two predetermined frequencies for each local oscillator, whereby the second oscillator frequency can be adjusted independently of the first oscillator frequency. Adjustment between the two frequencies is used to adapt to the different output frequencies, while eliminating noise caused by the local oscillators. Similar to U.S. Pat. No. 5,640,497, German Patent No. Application 4,306,578 adjusts the oscillator frequencies by a predetermined amount in order to eliminate noise. PCT International Patent Application No. 84/04637 employs two local oscillators that generate predetermined frequencies, in which the second oscillator is selected between one of two frequencies to eliminate this noise.

Accordingly, there exists a need for an inexpensive method to adapt the output of a settop terminal to a variety of television broadcast standards.

SUMMARY

The present invention is a universal modulator that accepts baseband audio and video inputs and modulated audio or data and converts the combined signal to one of a plurality of frequencies in dependence upon a desired output frequency and broadcast standard. The universal modulator is located between baseband video and audio outputs of a settop terminal demodulator/decoder and an antenna input of a television receiver or other audio/video component (such as a VCR). The universal modulator includes a dual conversion architecture using an up-converter mixer and a down-converter mixer. Each mixer receives an oscillator input from a corresponding addressable, programmable, PLL (phase-locked loop) frequency synthesizer. Each PLL frequency is controlled by firmware in the settop terminal. Configuration is performed via manual input using settop terminal controls, or interrogation directly by the CATV headend or by programmed settings. A communication bus coupled to the firmware distributes addressable instructions to selectively control each PLL frequency and obviate oscillator difference beat frequencies (ODBFs) that may be manifested.

Accordingly, it is an object of the present invention to provide a universal modulator within a settop terminal which is able to couple a CATV transmission network to a customer's television receiver notwithstanding the broadcast standard used to transmit the television programs.

Other objects and advantages will become apparent to those skilled in this art after reading the detailed description of the preferred embodiment.

DETAILED DESCRIPTION OF THE PREFERRED EMBODIMENTS

The preferred embodiment will be described with reference to the drawing figures where like numerals represent like elements throughout.

Figure 2:
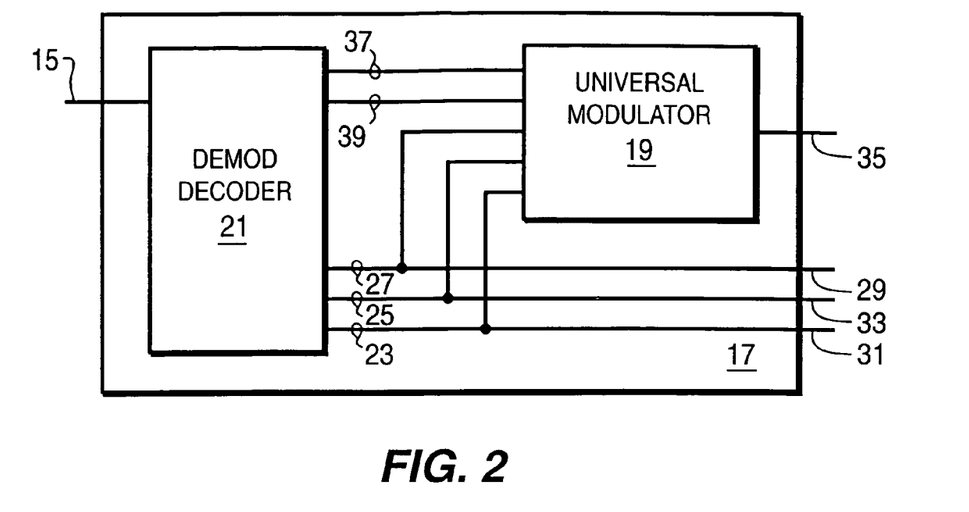
FIG. 2 is a block diagram of a settop terminal incorporating the present invention.

FIG. 2 is a block diagram of a settop terminal 17 with a universal modulator 19 shown coupled to the outputs 23, 25, 27 of a demodulator/decoder 21. The demodulator/decoder 21 supplies a customer's channel selection to the universal modulator 19 as a baseband audio signal via the output 23 and as a baseband video signal via the output 25. An alternate (second) audio signal, such as a NICAM carrier or modulated audio signal which differs from the baseband audio signal, may also be supplied to the universal modulator 19 via the output 27 of the demodulator/decoder 21. A reference clock signal 37 originating from a master oscillator (not shown) and a common communication bus 39 are also coupled to the universal modulator 19. The functional description of the demodulator/decoder 21 is beyond the scope of the present invention and shall not be described in further detail.

The higher quality baseband audio and video signals provided by outputs 23 and 25 of the demodulator/decoder 21 are made available as settop terminal outputs 31, 33, respectively, and may be coupled to television receivers that have baseband inputs. The alternate audio signal provided by output 27 may be made available as settop terminal output 29. For television receivers that lack these features, the universal modulator 19 provides an up-conversion output 35 compatible with the television broadcast standard used, from baseband to VHF or UHF for coupling to an antenna input.

Figure 3:
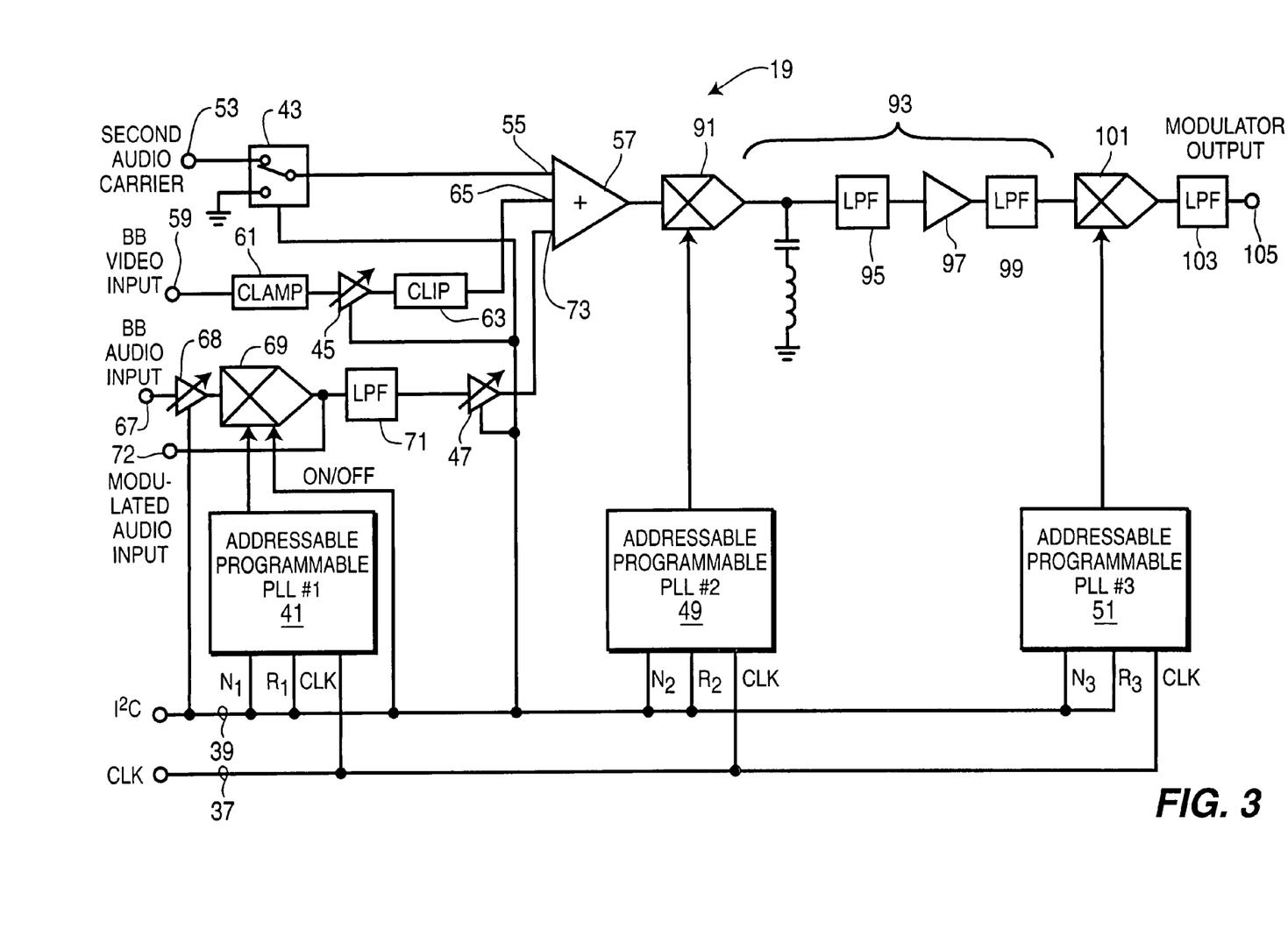
FIG. 3 is a block diagram of the preferred embodiment of the universal modulator of the present invention for use in a settop terminal.

The universal modulator 19 is shown in more detail in FIG. 3. The common communication bus 39 shown is an I²C interface from Phillips® Electronics. Other bus communication protocols may alternatively be used. The configuration for a settop terminal 17 may be downloaded from the CATV system headend via a dedicated channel, or inband on the VBI of a channel. One skilled in this art would appreciate that an advanced cable system can address and interrogate a specific settop terminal and alter its functionality. If the settop terminal has all configurations stored in firmware, the CATV system headend may simply instruct the settop terminal 17 of the standard being used. In this fashion, the settop terminal 17 does not require a technician to configure the unit but can auto-configure upon initial energization.

The communication bus protocol permits configuring component parameters to a particular broadcast standard using a unique addressing system within the settop terminal 17. As shown in FIG. 3, the I²C bus 39 communicates with: an addressable programmable PLL frequency synthesizer 41 for a baseband audio mixer 69, a solid state switch 43, adjustable amplifiers for the baseband video input 45 and baseband audio input 47, an addressable programmable PLL frequency synthesizer 49 for an up-conversion mixer 91 and an addressable programmable PLL frequency synthesizer 51 for a down-conversion mixer 101. Although the addressable programmable PLL frequency synthesizer 51 has been described as being coupled to a "down-conversion" mixer 101, the down-conversion mixer 101 may in fact further up-convert a HI-IF signal 93 to a higher frequency signal. It should be noted that each PLL frequency synthesizer 41, 49, 51 has an associated oscillator driver L01, L02, L03 respectively (not shown). Each respective component has its own address to permit firmware contained parameters to be loaded for a given broadcast standard configuration.

An alternate (second) audio carrier 53, provided by the output 27 of the demodulator/decoder 21, is coupled to the solid state switch 43. The output of the switch 43 is coupled to a first input 55 of a summing amplifier 57. The baseband video input 59 is coupled to a clamp 61 which limits signal amplitude. The output from the clamp 61 is coupled to the video adjustable amplifier 45 where signal gain is increased or attenuated depending upon the broadcast standard. The output from the adjustable amplifier 45 is coupled to a hard limiter 63 which clips signal peaks. The output from the limiter 63 is coupled to a second input 65 of the summing amplifier 57. The baseband audio input 67 is coupled to a baseband audio mixer 69 via an adjustable amplifier 68. The baseband audio mixer 69 modulates the baseband to the broadcast standard. The baseband audio mixer 69 may be selectively activated or deactivated by the I²C bus as required to support the standard in use. The output from the baseband audio mixer 69 is coupled to a lowpass filter 71 to remove RF. A second input to the audio lowpass filter 71 is provided as a modulated audio input 72. The audio lowpass filter 71 is coupled to an audio adjustable amplifier 47 where signal gain is increased or attenuated. The audio adjustable amplifier 47 output is coupled to a third input 73 of the summing amplifier 57.

Figure 4:
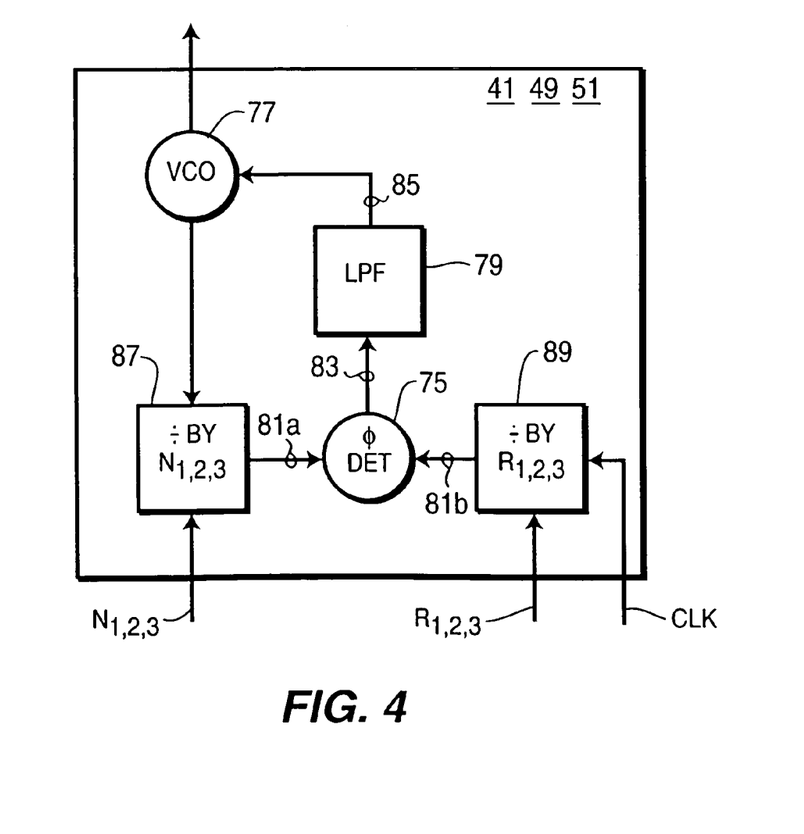
FIG. 4 is a block diagram of an addressable, programmable, phase-locked loop.

Each of the mixers mix a signal input with the outputs of the three addressable, programmable PLL frequency synthesizers 41, 49, 51. The PLL output frequencies vary depending on the broadcast standard and the RF output frequency 105 desired. An addressable, programmable PLL frequency synthesizer 41, 49, 51 is shown in FIG. 4.

The PLL 41, 49, 51 includes a phase detector 75, a voltage-controlled oscillator (VCO) 77 and a loop filter 79. The programmable PLL uses digital and analog techniques for frequency synthesis. The phase detector 75 compares two input frequencies 81a, 81b and generates an output 83 that is a measure of their phase difference. If both inputs 81a, 81b differ in frequency, the output is periodic at the difference frequency. If the frequency input does not equal the frequency output of the VCO 77, the phase-error signal, after being filtered, causes the VCO frequency to deviate in the direction of the input frequency. When the frequencies match, the VCO 77 locks to the input frequency maintaining a fixed phase relationship with the input signal. The filtered output of the phase detector 75 is a dc signal. A modulo-n counter 87 is coupled between the VCO 77 output and the second input 81a to the phase detector 75 to generate a multiple of the input reference frequency providing frequency synthesis.

Each PLL synthesizer 41, 49, 51 employed in the present invention 19 is addressable such that the input frequency can be adjusted by using an input modulo-n counter 89 or divide-by-n to adjust output frequency. Both the input frequency divide-by-n 89 and loop frequency divide-by-n 87 are addressable components. Each of the PLLs 41, 49, 51 are addressed and controlled in accordance with a predetermined settop terminal 17 configuration. The configuration determines both the output frequency and operating bandwidth of the settop terminal 17 and adjusts the up- and down-converter PLLs 49, 51 accordingly.

Referring back to FIG. 3, the summer amplifier 57 output is modulated with the frequency output from the second programmable PLL 49 to drive the up-conversion mixer 91 and translate the summed output to a high intermediate frequency (HI-IF) 93. The HI-IF 93 is higher than the highest expected frequency in the summed amplifier 57 output bandwidth. In the present invention 19, the input to the up-conversion mixer 91 is not bandwidth limited.

The summing amplifier 57 output frequencies are translated to a new bandwidth, starting at a low frequency of the second PLL 49 minus the highest input band frequency, and ending at a high frequency of the third PLL 51 minus the lowest input band frequency. The second PLL 49 frequency is selected to translate the summing amplifier 57 output to correspond to the passband of an intermediate lowpass filter 95. The output from the lowpass filter 95 is coupled to a buffer amplifier 97 to restore gain losses. The output from the buffer amplifier 97 is input to a final lowpass filter 99. The buffer amplifier 97 maintains the system noise figure by overcoming the losses in the up-conversion mixer 91 and first HI-IF filter 95. The signal is filtered by a HI-IF filter 99, with the output coupled to a down-conversion mixer 101. The third PLL synthesizer 51 is coupled to the down-conversion mixer 101. The difference between the HI-IF 93 and the third PLL 51 frequency is the desired output channel in the IF band. It should, however, be noted that the down-conversion mixer 101 may accept the HI-IF 93 and further up-convert the signal to a higher frequency RF signal. The output is then filtered via a low pass filter 103, (or other appropriate filter if up-converted), and forwarded as an RF output frequency 105 for reception by a television receiver.

As discussed above, the second 49 and third 51 programmable PLLs are controlled by the common communication bus 39. The bus 39 is coupled to a processor in the settop terminal demodulator/decoder 21 which receives instructions from the system headend or from the settop terminal's 17 keypad. The configuration takes place transparently upon initial energization of the unit 17 if the system headend is equipped to send broadcast configuration instructions to the settop terminal 17. If the system headend does not have this capability, the settop terminal 17 is configured via the keypad and function display (not shown). The configuration request, whether from the headend or at a consumer location, outputs the predetermined parameters onto the I$^2$C bus 39 for each of the addressable components. The predetermined parameters are related to the standard that is being employed by the CATV system on which the settop terminal 17 is located. These parameters will include the determination of whether a second audio carrier 53 exists, whether the baseband audio input 67 or the modulated audio input 72 are to be used and the frequency at which the RF output frequency 105 is desired. These parameters may also include any other configurable parameters which are employed by any of the addressable components coupled to the communication bus 39. It should also be recognized that since many of the components are addressable by the communication bus 39, a user may manually input and address a particular component and selectively configure that component if desired.

An undesirable artifact of dual conversion is the generation of harmonics based on the fundamental oscillator frequencies. The harmonics of the second and third PLL frequency synthesizers 49, 51 mix with each other, thereby creating ODBFs. To obviate the intrusive effects of these PLL harmonics, the system and method of the present invention 119 eliminate this type of interference by translating the significant ODBFs out of the desired output channel.

Figure 5:
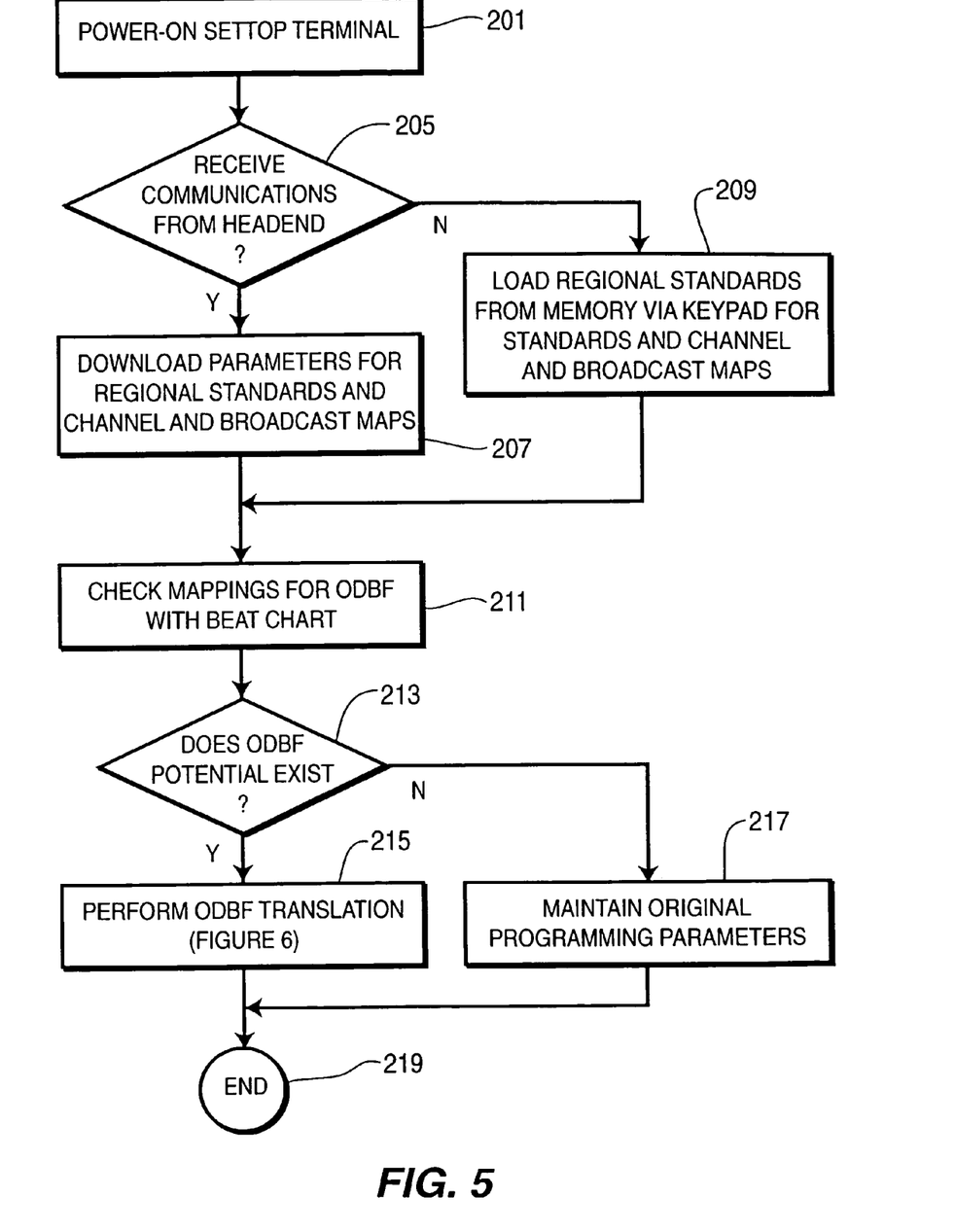
FIG. 5 is a flow chart of the universal modulator configuring process.

A flowchart of the preferred method of the present invention 19 is shown in FIG. 5. Upon making the necessary connections to the CATV cable 15 and subscriber's television receiver, the settop terminal 17 is energized (step 201) establishing communication with the system headend. If the cable system headend has forward communication ability (step 205), the settop terminal is instructed how to configure itself for the applicable broadcast standard by downloading the parameters for the regional standards being used and the channel broadcast maps (step 207). The predetermined PLL frequencies derived from the channel and broadcast maps in memory are converted into corresponding "divide-by" numbers for the PLL modulo-n, converters 87, 89 and output to the second 49 and third 51 PLL frequency synthesizers. The settop terminal 17 acknowledges when configuration is complete. If the cable system does not have forward communication capability, the user will be prompted to enter the applicable information via a display and keypad, thereby manually loading the applicable broadcast configuration (step 209).

Figure 6:
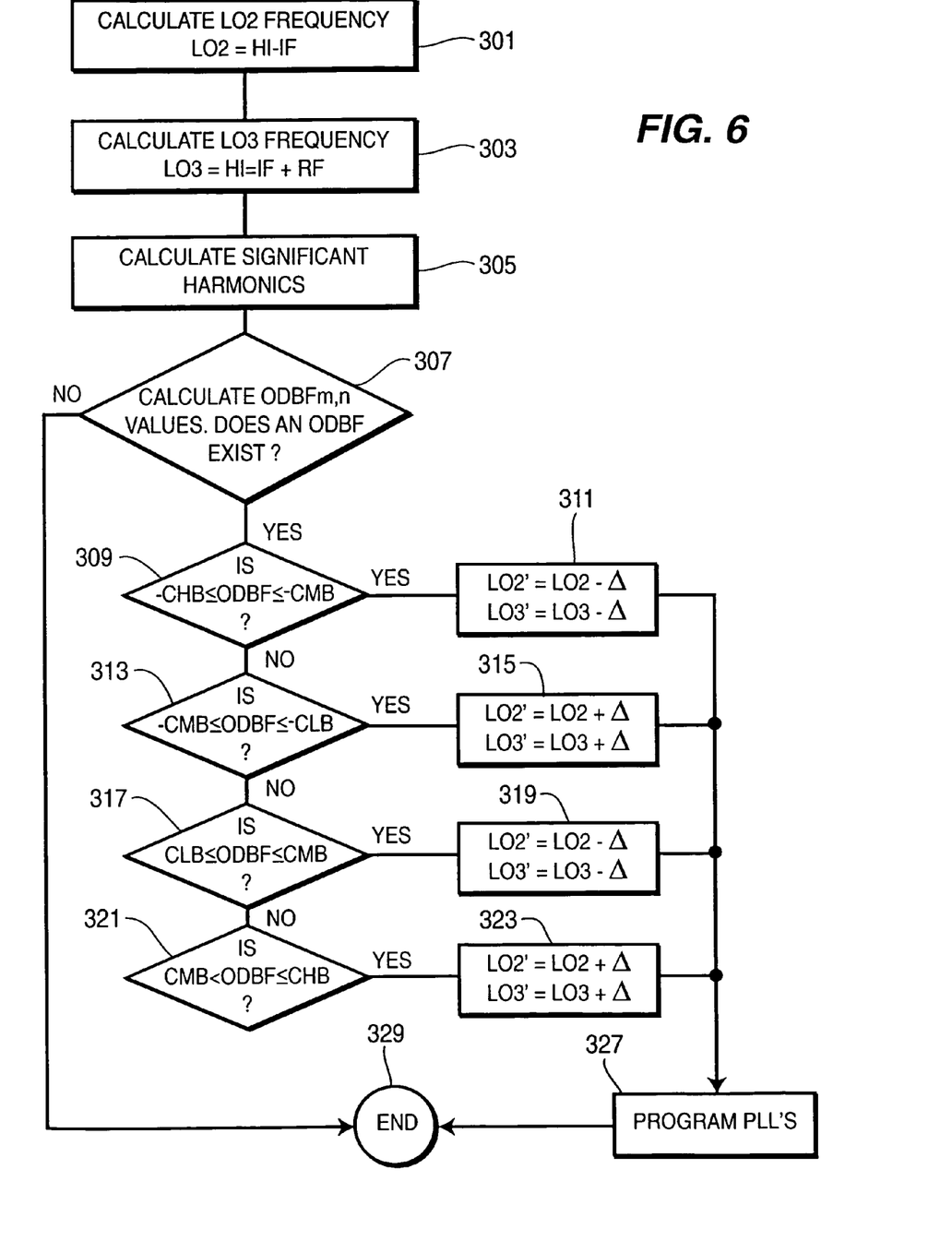
FIG. 6 is a flow chart of the ODBF translation process.

The settop terminal 19 reviews the loaded channel and broadcast maps. The predetermined frequencies are examined for potential ODBFs (step 211). If it is determined that ODBF's are likely (step 213), an ODBF translation is performed (step 215) as shown in FIG. 6 (which will be explained in greater detail hereafter). Otherwise, the original frequencies are maintained (step 217) (FIG. 5) The frequencies are addressed to their respective PLL synthesizers as words over the I$^2$C communication bus (step 219).

Referring to the flow diagram of FIG. 6, the elimination of ODBFs is achieved by selectively adjusting the frequencies of the second 49 and third PLLs 51 to obtain the desired RF output frequency. For a typical NTSC signal, the up-converter mixer 91 modulates the input video 59 and audio signals 67 with the output 93 of the second PLL 49 to up-convert the input RF signal of the selected channel to the HI-IF 93 (step 301).

$$LO1 = \text{audio carrier frequency} \qquad \text{(Equation 1)}$$

$$LO2 = \text{HI-IF} \qquad \text{(Equation 2)}$$

The down-converter mixer mixes 101 the HI-IF 93 with the output of the third PLL synthesizer 51 (step 303) to down-convert, (or further up-convert if desired), to obtain the desired RF output frequency 105.

$$LO3 = (HI\text{-}IF) + RF \text{ output} \qquad \text{(Equation 3)}$$

Multiples of the second and third PLL synthesizer 49, 51 fundamental frequencies define the even and odd harmonics, $$m(LO2) \text{ and } m(LO3), \text{ for } m=1, 2, 3, 4, \ldots \infty, \qquad \text{(Equation 4)}$$

which represent all possible harmonics (step 305). However, due to the high system frequencies involved, examination of frequencies beyond the 10th harmonic is unnecessary.

The existence of an interfering ODBF is determined by serially calculating the differences between two harmonics of the second 49 and 51 third PLL synthesizers that are separated by at least one degree until the absolute value of an ODBFm,n is within a given bandwidth or a predetermined number of ODBFm,n values are calculated. When an ODBFm,n absolute value is found within the RF channel bandwidth, it is designated as an interfering oscillator difference beat frequency (ODBF). The general equation for calculating ODBFs is:

$$OBDF_{m,n} = (m+n)(LO2) - (m)(LO3),$$
$$\text{for } m=1, 2, 3, 4, \ldots 10, \qquad \text{(Equation 5)}$$

with n=1 for a first series, n=2 for a second series, n=3 for a third series, and so on up to n=8 for all previously calculated harmonics (step 305). The ODBFm,n calculated from the differing degrees of the second 49 and third PLL 51 harmonics are then examined (step 307). For example, if the ODBF lies outside of the desired RF output channel bandwidth, no adjustment of the second 49 and third 51 PLL frequency synthesizers is required.

For an ODBF which falls inband, the following equations can be used to determine which direction the second 49 and third 51 PLL frequencies should be adjusted to translate the ODBF out of band. In these equations, CLB is the channel low-band; CMB is the channel mid-band; and CHB is the channel high-band.

If $-CHB \leq ODBF < -CMB$; then HI-IF is moved downward. (Equation 6A)

(If the result of Equation 5 is negative and the magnitude is greater than the mid-band of the desired RF output channel (step 309), the HI-IF is moved downward (step 311)).

If $-CMB \leq ODBF < -CLB$; then HI-IF is moved upward. (Equation 6B)

(If the result of Equation 5 is negative and the magnitude is less than or equal to the mid-band of the desired RF output channel (step 313), the HI-IF is moved upward (step 315)).

If $CLB \leq ODBF \leq CMB$; then HI-IF is moved downward. (Equation 6C)

(If the result of Equation 5 is positive and the magnitude is less or equal to than the mid-band of the desired RF output channel (step 317), the HI-IF is moved downward (step 319)).

If $CMB < ODBF \leq CHB$; then HI-IF is moved upward. (Equation 6D)

(If the result of Equation 5 is positive and the magnitude is greater than the mid-band of the desired RF output channel (step 321), the HI-IF is moved upward (step 323)).

The second 49 and third 51 PLLs are then adjusted (step 327) in accordance with the following: To translate the oscillator difference beats below or above the desired RF output channel, the following equation is used to determine the A in frequency for the second 49 and third 51 PLL frequency synthesizers.

$$\Delta = \frac{CMB - [(m+n)(LO2) - m(LO3)]}{(m+n) - m} \quad \text{(Equation 7)}$$

The new second 49 and third 51 PLL frequencies (LO2' and LO3' respectively) are derived as shown in LO2' is calculated as shown in FIG. 6.

The new PLL frequencies LO2' and LO3' translate the ODBFs above or below the desired RF output channel. The new PLL frequency values are used to program the second 49 and third 51 PLL frequency synthesizers (step 327).

In an alternative embodiment, a fixed value for $\Delta$ can be used to simplify the calculations and the operation of the system. For example, a value of 4 MHz for $\Delta$ will suffice for NTSC and PAL systems.

The present invention will now be explained with reference to several examples. In the first example, if the HI-IF is 960 MHz and the desired RF output channel has a picture carrier frequency of 319.25 MHz, we have the following:

$LO2 = HI\text{-}IF = 960$ MHz; and (from Equation 2)

$LO3 = HI - IF + RF$ output (from Equation 3)

$= 960 + 319.25 = 1279.25$ MHz.

Figure 9A:
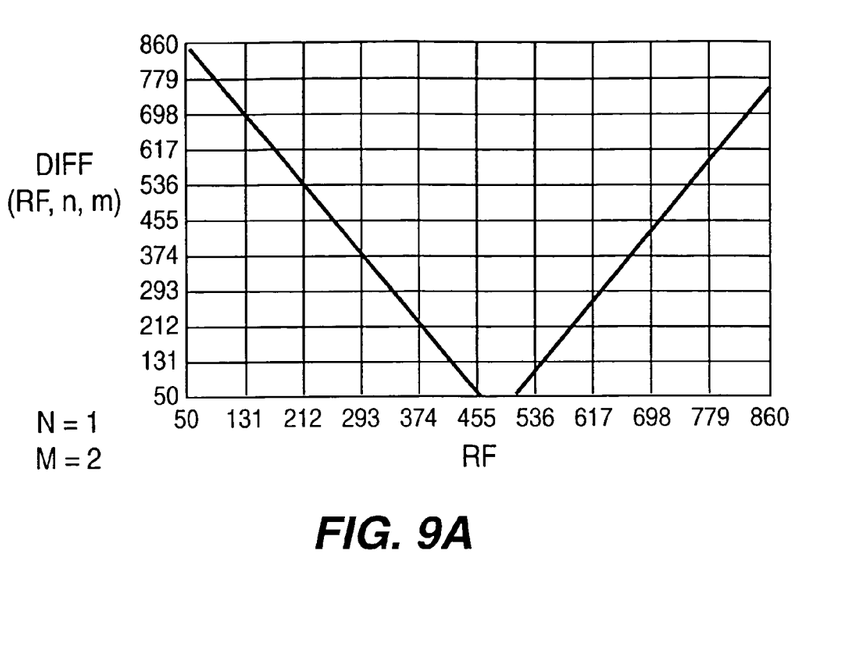
FIGS. 9A and 9B are graphs of oscillator difference beat frequencies.

The graph for ODBFs versus the RF output frequencies for m=2 and n=1 is shown in FIG. 9A. If m=2 and n=1, then:

$ODBF_{2,1}(960) = (m+n)(LO2) - m(LO3)$ (from Equation 5)

$= 3(960) - 2(1279.25)$ $= 2880 - 2558.5 = 321.5$ MHz

Since the desired RF output channel has a picture carrier frequency of 319.25 MHz (and assuming the bandwidth is 6 MHz for an NTSC channel), the ODBF is in-band for the desired RF output channel. From Equation 6D, since the ODBF is above the mid-band of the desired RF output channel, the HI-IF is moved upward. Assuming that $\Delta$ will be a fixed value of 4 MHz, LO2' will be 964 MHz and LO3' will be 1283.25 MHz.

Accordingly, from Equation 5:

$ODBF_{2,1}(964) = 3(964) - 2(964 + 319.25)$ $= 2892 - 2566.5 = 325.5$ MHz

The ODBF is now out of band.

In the second example, if the HI-IF is 960 MHz and the desired RF output channel has a picture carrier frequency of 481.25 MHz, we then have the following:

$LO2 = HI\text{-}IF = 960$ MHz; and (from Equation 2)

$LO3 = HI - IF + RF$ output (from Equation 3)

$= 960 + 481.25 = 1441.25$ MHz.

Figure 9B:
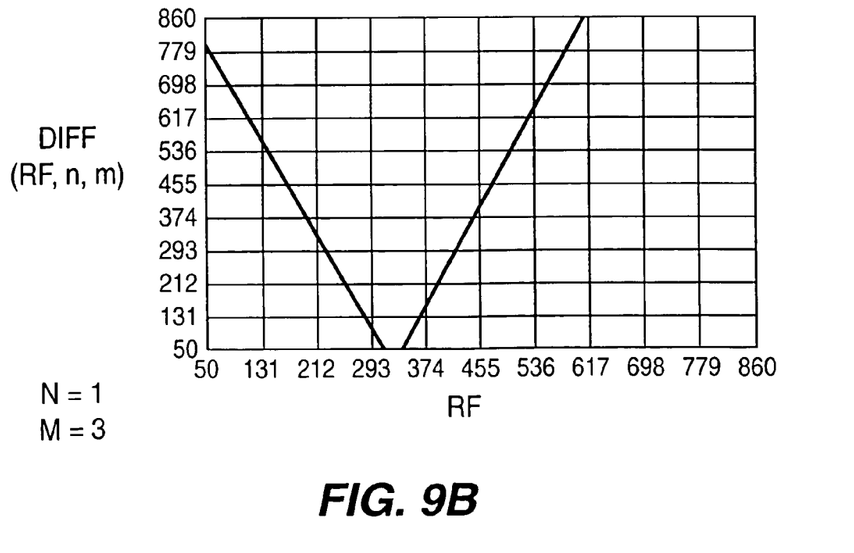

The graph for ODBFs versus the RF output frequencies for m=3 and n=1 is shown in FIG. 9B. If m=3 and n=1, the ODBF can be calculated as:

$ODBF_{3,1}(960) = 4(960) - 3(1441.25)$ (from Equation 5)

$= 3840 - 4323.75$ $= -483.75$ MHz.

Since the selected channel is 481.25 MHz, (and assuming an NTSC channel), the ODBF is in-band and the HI-IF must be relocated. The result of Equation 5 for this example is negative and the magnitude is greater than the mid-band of the desired RF output channel (481.25 MHz). Accordingly, from Equation 6A, the HI-IF is moved lower. Assuming that A will be a fixed value of 4 MHz, LO2' will be 956 MHz and LO3' will be 1437.25 MHz. Recalculating the ODBF provides:

$ODBF_{3,1}(956) = 4(956) - 3(956 + 481.25)$ (from Equation 5)

$= 3824 - 4311.75$ $= -487.75$ MHz.

The ODBF is now out of band.

Due to the simple design of the present invention and since there are no shielding requirements to avoid ODBFs, the universal modulator may be incorporated onto a single integrated circuit. This was not possible with prior art signs.

Although the present invention has been described with reference to a settop terminal, it should be understood by those of skill in the art that the invention is adaptable to other applications within the CATV environment, or even other communication applications which do not pertain to CATV systems.

Figure 7:
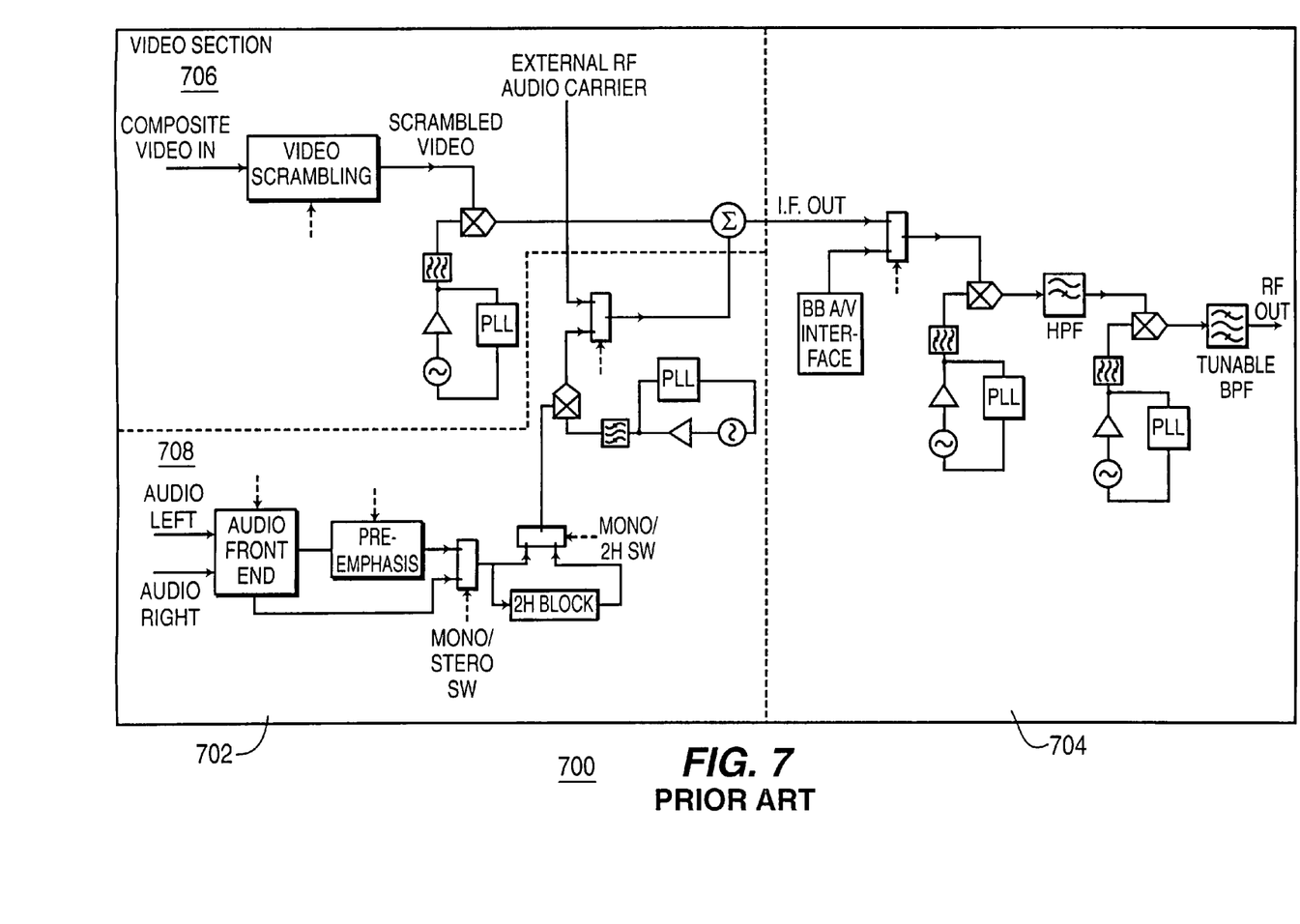
FIG. 7 is a block diagram of a prior art headend.

For example, as shown in FIG. 7, a prior art headend 700 generally includes two pieces of equipment; a baseband section 702 and an IF section 704. These two sections 702, 704 are typically designed to operate as "stand alone" units. Together, the two sections 702, 704 output a single RF channel. The baseband section 702 generally comprises a video section 706 and an audio section 708. These sections 706, 708 receive audio and video baseband inputs and combine these inputs to an intermediate frequency for output to the IF section 704. In the IF section 704, the intermediate frequency is up-converted to the desired RF output channel. Since both sections 702, 704 comprise units of equipment which are designed to work independently, this requires the duplication of many components between units 702, 704.

Figure 8:
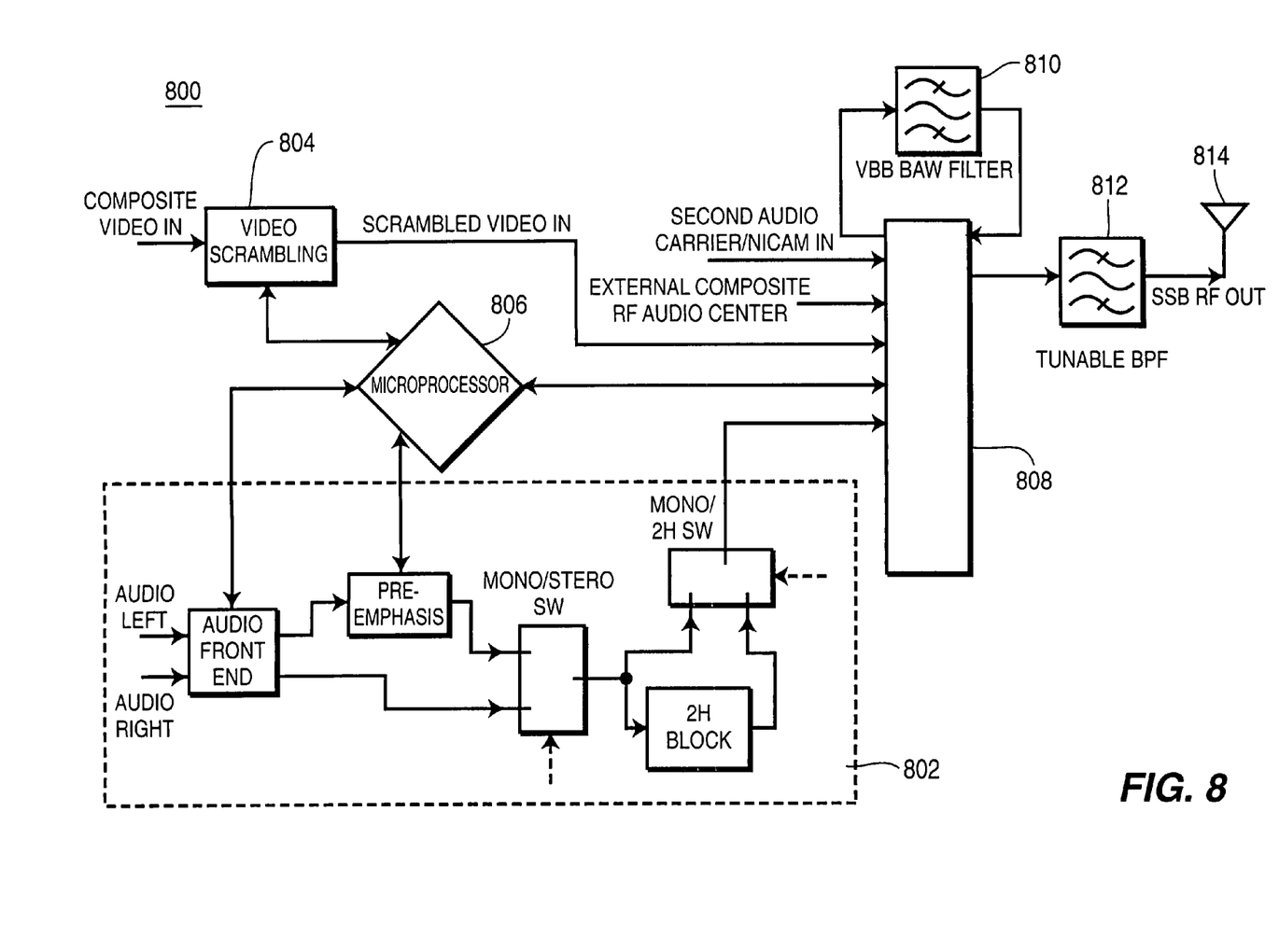
FIG. 8 is a block diagram of a headend made in accordance with the present invention.

Referring to FIG. 8, a headend 800 made in accordance with the present invention is shown. The headend 800 includes an audio pre-processing section 802, a video pre-processing section 804, the universal modulator 808 of the present invention (which is coupled to two filters 810, 812), a transmitter 814 (if desired), and a microprocessor 806, which controls all of the components of the headend 800. As was previously described hereinbefore, since the universal modulator 808 can convert a baseband input signal to any desired RF output signal while avoiding ODBFs, the universal modulator 808 may be utilized to replace most of the components in the baseband section 702 and the IF section 704. This significantly reduces the number of components required for a headend 800. Accordingly, the cost and complexity are also thereby reduced.

It should be understood by those of skill in the art, with reference to FIG. 8, that the universal modulator 808 of the present invention may also be used to accept a baseband digital VSB signal and remodulate the signal to a desired RF output signal for use with broadcast HDTV television receivers. The universal modulator 808 could also be used to transmit RF signals to devices which require high frequency RF signals, including wireless appliances such as a cordless telephone or a wireless LAN receiver. In such an application, the second mixer up-converts the HI-IF signal to a higher frequency RF signal, instead of down-converting the HI-IF as previously described. The desired RF output signal would be:

RF output =(HI-IF)+L03             (Equation 10)

The RF output signal may then be transmitted directly to the wireless appliance.

We claim:

1. A modulator for combining a plurality of received signals and outputting a desired output signal, the modulator comprising:

(a) a summing amplifier having a first input for receiving a video signal, a second input for receiving a first audio signal, a third input for receiving a second audio signal, and an output for outputting a modulated summed signal;

(b) a first frequency synthesizer for generating a first frequency for mixing with the modulated summed signal to generate a high intermediate frequency (HI-IF) signal;

(c) a second frequency synthesizer for generating a second frequency for mixing with the HI-IF signal to generate the desired output signal;

(d) an audio mixer for receiving a baseband audio input signal and outputting the first audio signal to the second input of the summing amplifier;

(e) a third frequency synthesizer electrically coupled to the audio mixer for generating a third frequency for mixing with the baseband audio input signal to generate the first audio signal;

(f) a common communication bus, electrically coupled to the first, second and third synthesizers, for programming the first, second and third frequencies; and (g) a switch, electrically coupled to the common communication bus, for selectively providing the second audio signal to the third input of the summing amplifier.

2. The modulator of claim 1 further comprising:

(h) an up-conversion mixer having an input electrically coupled to the output of the summing amplifier for receiving the modulated summed signal and outputting the HI-IF signal.

3. The modulator of claim 2 wherein the up-conversion mixer is electrically coupled to the first frequency synthesizer for receiving the first frequency for mixing with the modulated summed signal to generate the HI-IF signal.

4. The modulator of claim 1 further comprising:

(h) a down-conversion mixer for receiving the HI-IF signal and outputting the desired output signal.

5. The modulator of claim 4 wherein the down-conversion mixer is electrically coupled to the second frequency synthesizer for receiving the second frequency for mixing with the HI-IF signal to generate the desired output signal.

6. The modulator of claim 1 further comprising a clamp for limiting the amplitude of the video signal.

7. The modulator of claim 6 further comprising an adjustable amplifier, electrically coupled to the clamp, for adjusting the gain of the video signal.

8. The modulator of claim 7 further comprising a common communication bus, electrically coupled to the adjustable amplifier, for controlling the gain adjustment.

9. The modulator of claim 7 further comprising a limiter, electrically coupled to the adjustable amplifier, for clipping signal peaks of the video signal.

10. The modulator of claim 1 further comprising an adjustable amplifier for adjusting the gain of the first audio signal.

11. The modulator of claim 10 further comprising a common communication bus, electrically coupled to the adjustable amplifier, for controlling the gain adjustment.

12. The modulator of claim 1 wherein the modulator is incorporated into a cable television (CATV) settop box.

13. The modulator of claim 12 wherein the desired output signal is coupled to a television receiver external to the modulator.

* * * * *